United States Patent
Campbell et al.

(10) Patent No.: US 7,061,267 B2
(45) Date of Patent: Jun. 13, 2006

(54) PAGE BOUNDARY DETECTOR

(75) Inventors: Kevin T. Campbell, Fort Collins, CO (US); Timothy D. Thompson, Windsor, CO (US); Christopher D. Paulson, Fort Collins, CO (US)

(73) Assignee: LSI Logic Corporation, Milpitas, CA (US)

( * ) Notice: Subject to any disclaimer, the term of this patent is extended or adjusted under 35 U.S.C. 154(b) by 173 days.

(21) Appl. No.: 10/687,991

(22) Filed: Oct. 17, 2003

(65) Prior Publication Data

US 2005/0086595 A1    Apr. 21, 2005

(51) Int. Cl.
*H03K 19/173* (2006.01)

(52) U.S. Cl. .................................. 326/38; 715/517
(58) Field of Classification Search ............ 326/37, 326/38; 358/1.2; 715/517

See application file for complete search history.

(56) References Cited

U.S. PATENT DOCUMENTS

| | | | | |
|---|---|---|---|---|
| 4,406,537 A | * | 9/1983 | Mori | 399/14 |
| 4,717,967 A | * | 1/1988 | Yoshida | 358/296 |
| 4,908,672 A | * | 3/1990 | Ito | 399/82 |
| 6,181,432 B1 | * | 1/2001 | Furuya | 358/1.11 |

OTHER PUBLICATIONS

Mano, Morris, Degital Design, 1984, Prentice Hall INC., pp. 145-146.*

* cited by examiner

*Primary Examiner*—Don Le
(74) *Attorney, Agent, or Firm*—Cochran Freund & Young LLC

(57) ABSTRACT

A logical gate and a comparator are used to detect page boundaries in a data stream. A current address and a predetermined page size, that is an integer power of 2, are compared using a Boolean logic gate such as AND or XOR to detect a page boundary in a data stream. The output from the Boolean logic gate is compared to a predetermined value to cause a signal to be generated, indicating the end of the page.

20 Claims, 3 Drawing Sheets

US 7,061,267 B2

PAGE BOUNDARY DETECTOR

BACKGROUND OF THE INVENTION a. Field of the Invention

The present invention pertains generally to partitioning of data streams and more specifically for programmable logic circuits for the detection of page boundaries in data streams.

b. Description of the Background

Page boundaries are used during data transfer for various purposes. In some cases, a page boundary may indicate a physical limitation of data storage. In other cases, long streams of data may be broken up into smaller sections for the calculation of CRC, parity, or other data integrity mechanisms.

In many cases, various embodiments are implemented in hardware, using a counter register or other preconfigured logic circuitry. Such circuitry may be dedicated to the performance of a single task and thereby be optimized for speed.

However, pagination circuitry, such as described above may require rather complex counter registers that increment with every clock cycle or every transfer of data. Counter registers may also occupy a relatively large area of an integrated circuit, which is space that may be otherwise used for additional circuitry. Further, as clock speeds increase, it has become increasingly difficult to design counter register circuits that are capable of counting at higher and higher speeds.

It would therefore be advantageous to provide a method and circuit for detecting page boundaries that uses a small amount of integrated circuit space. Further, it would be advantageous to provide a method and circuit that are capable of performing the required tasks at a very high speed.

SUMMARY OF THE INVENTION

The present invention overcomes the disadvantages and limitations of previous solutions by providing a system and method for combining a current address with a predetermined page size using a Boolean logic gate such as AND or XOR to detect a page boundary in a data stream. The output from the Boolean logic gate is compared to a predetermined value causing a signal to be generated that indicates the end of the page.

An embodiment of the present invention may therefore comprise a method for detecting a page boundary in a data stream comprising: determining a page size; storing the page size in a binary page size register, the binary page register having a predetermined number of bits; receiving a data stream address, the data stream address being a binary address corresponding to the data stream; performing a Boolean logic operation on the data stream address and the page size using a Boolean logic gate to produce a binary output value; comparing the binary output value with a predetermined binary value using a comparator; and causing a boundary signal to change state when the output value is equal to the predetermined binary value.

Another embodiment of the present invention may comprise a detection circuit for detecting a page boundary in a data stream comprising: a binary page size register having a predetermined number of bits that is capable of storing a page size; an address input for receiving a data stream address that is a binary address corresponding to the data stream; a Boolean logic operator having the binary page size register and the address input as inputs and a resultant output; a binary compare register having a predetermined number of bits; and a comparator that compares the resultant output and the binary compare register as and generates a comparator output.

The advantages of the present invention are that fewer gates and other logical elements are required than solutions that use an incremental counter. Further, the simplicity of the circuit allows higher speed operation while reducing the amount of space on an integrated circuit that is required.

DETAILED DESCRIPTION OF THE INVENTION

Figure 1:
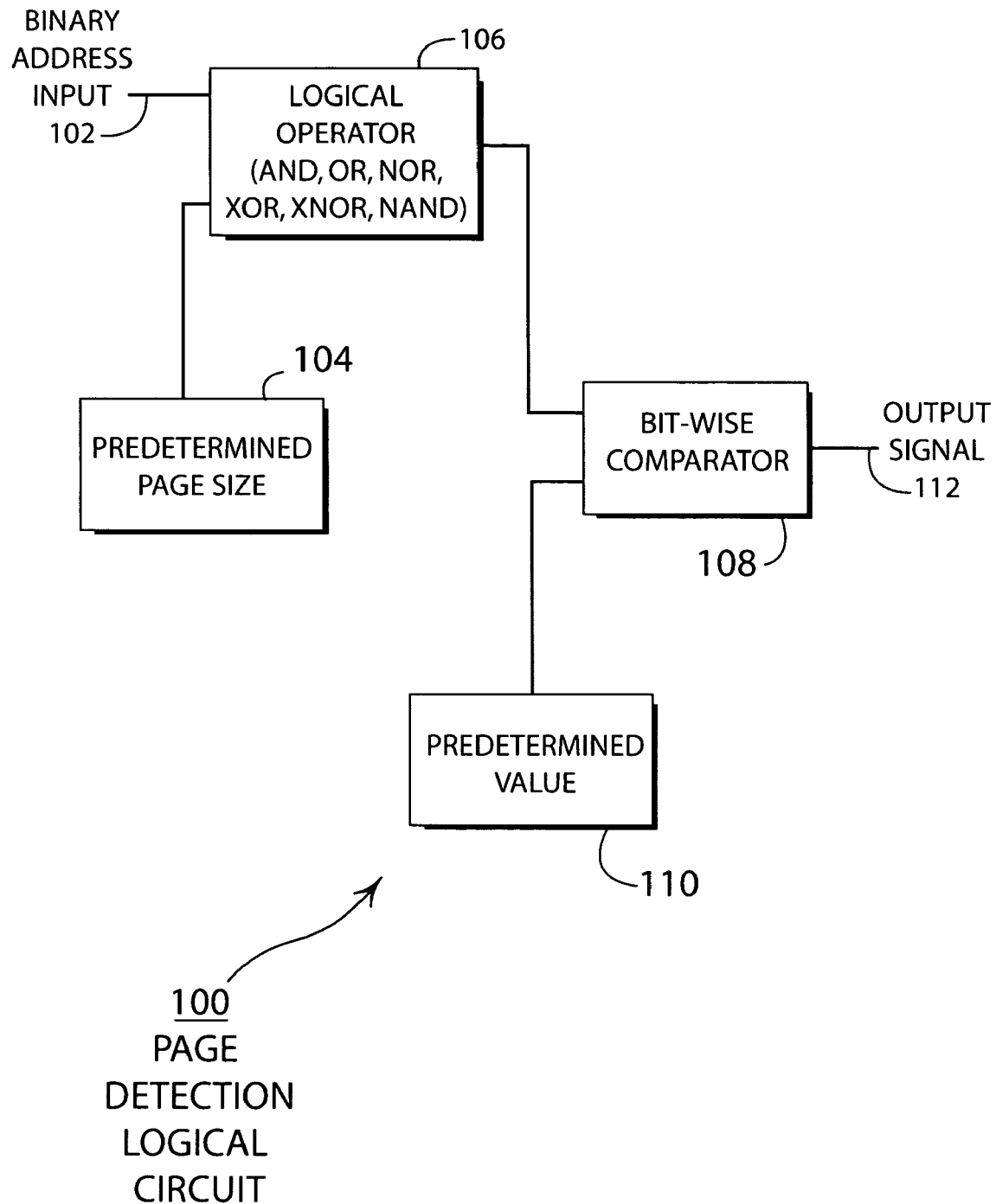
FIG. 1 is an illustration of an embodiment of the present invention showing a general logic circuit for the detection of page boundaries.

FIG. 1 illustrates an embodiment 100 of the present invention showing a logic circuit for the detection of page boundaries. A binary address input 102 and a predetermined page size 104 are input into a logical operator 106. The output of the logical operator and a predetermined value 110 are input into a bit-by-bit comparator 108 to generate an output signal 112.

The embodiment 100 may be used to monitor a data stream and to cause some action to occur at regular intervals of the data stream. For example, in a large data stream, it may be useful to compute a cyclic redundant check or CRC for specific intervals of the data. The CRC may be stored with the data and used to verify data integrity in subsequent operation. At a regular interval determined by the predetermined page size 104, the embodiment 100 will cause the output signal 112 to change state. The output signal 112 may trigger a CRC to be calculated or other function to occur. Those skilled in the arts will appreciate that various functions may be triggered by the output signal 112.

The binary address input 102 may be the current address of a data stream. The address 102 may be a binary numeral of a specific width. The predetermined page size 104 may be represented as a binary number. The actual page size can be determined by 2 to the power of the number of bits in the page size 104. For example, if the page size 104 were defined by eight bits, the page size would be 256 cycles. The binary address input 102 may be 16, 32, or any other number of bits wide.

As the address signal 102 increments, the logical operator 106 compares the page size 104 with the corresponding lowest bits of the address signal 102. The output of the logical operator 106 is compared to a predetermined value 110 and will cause the output signal 112 to change states each interval defined by 2 to the power of the number of bits in the page size 104.

For example, assume that the page size 104 was eight bits wide and set to 11111111. The logical operator 106 may be an AND gate, and the predetermined value 110 may also be set to 11111111. Assuming that the address input 102 was 16 bits wide, the output signal 112 may be fired when the address 102 was 0000000011111111 and every increment thereafter of 256 addresses.

The comparator 108 compares only the lowest bits, as defined by the page size 104 and value 110. Thus, as the address increases over and above the maximum number that may be represented by the page size 104 and value 110, the output signal 112 will not fire until another increment equal to the maximum number represented by page size 104 is reached again.

The page size 104 may be stored in a programmable or otherwise changeable register. In some embodiments, the page size 104 and the value 110 may be equal, and thus only one register may be necessary for both values.

The simplicity of the embodiment 100 is that only a small number of logical gates and storage registers are required. The number of gates and storage registers are less than the width of the address input 102. Thus, for a 64 bit address input 102, only 16 gates and registers would be required for a page size of 64K. The simplicity and reduction of number of components over other solutions would be appreciated by those skilled in the arts.

Figure 2:
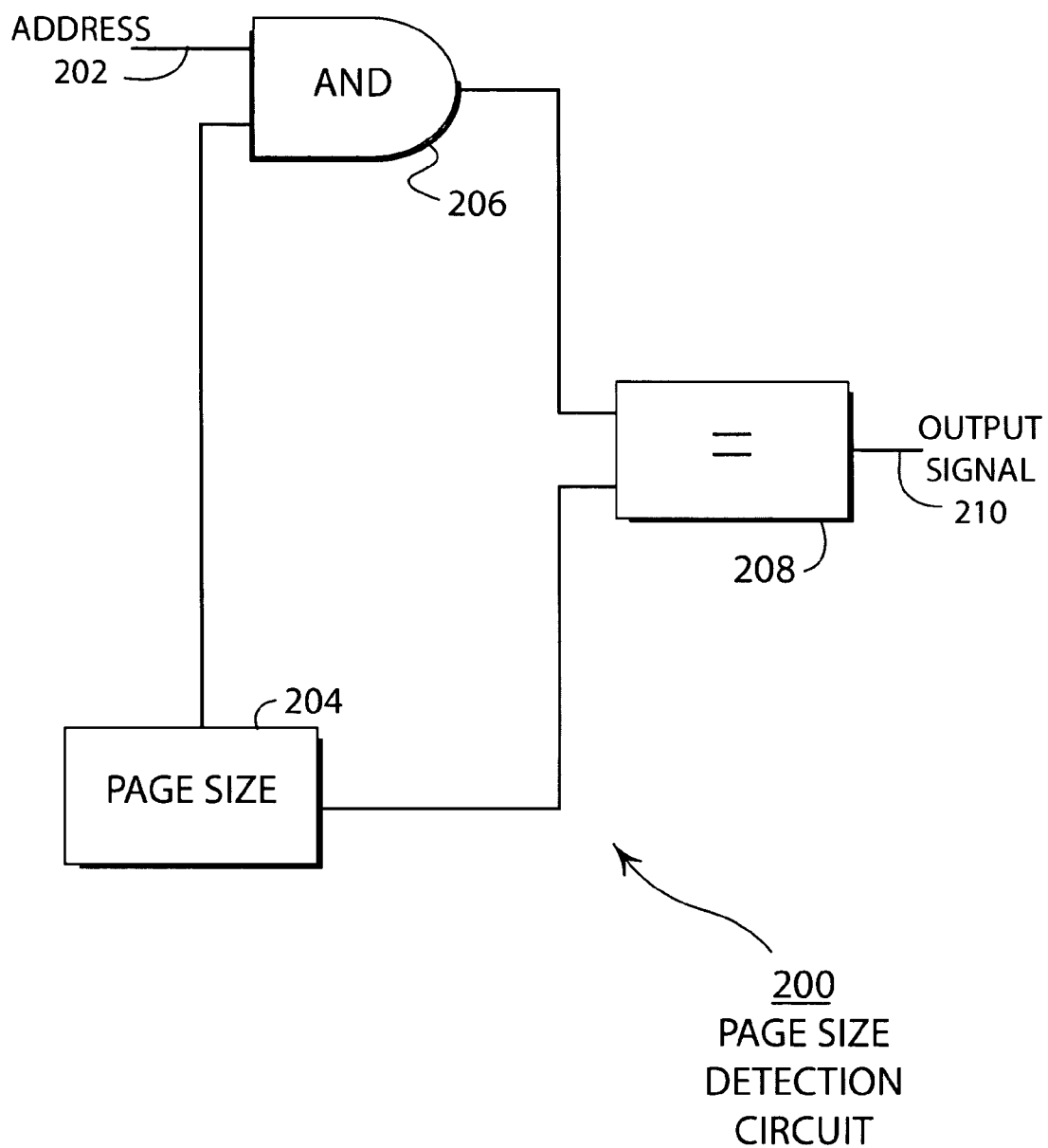
FIG. 2 is an illustration of an embodiment of the present invention showing a first specific embodiment of page size detection circuit.

FIG. 2 illustrates an embodiment 200 of a page size detection circuit. An address signal 202 and a page size 204 are evaluated with an AND gate 206. The output of the AND gate 206 is compared with the page size 204 with a comparator 208 to yield an output signal 210.

In the present embodiment, the page size 204 may be a binary number of fixed width, with the width being less than the width of the address 202. Further, the page size 204 may have all of the bits set to 1.

The embodiment 200 causes the output signal 210 to be raised high only when the last bits of the address 202 are all equal to 1. The output signal 210 may be used to cause some other action to occur.

Figure 3:
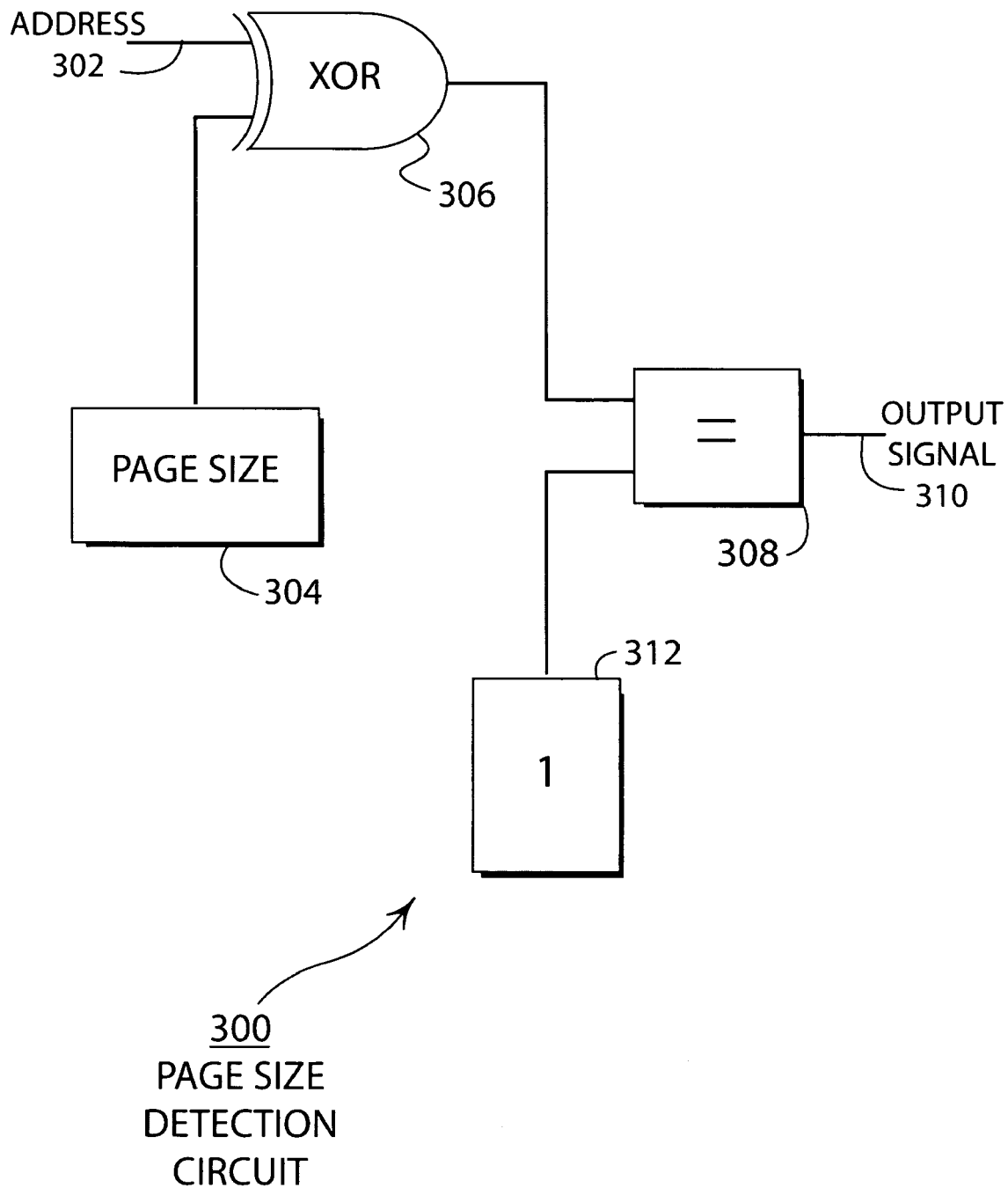
FIG. 3 is an illustration of an embodiment of the present invention showing a second specific embodiment of a page size detection circuit.

FIG. 3 illustrates an embodiment 300 of a page size detection circuit. An address signal 302 and a page size 304 are evaluated with an XOR gate 306. The output of the XOR gate 306 is compared with the register 312 containing 1 to yield an output signal 310.

The present embodiment has an advantage that the value contained in the page size register 304 is the offset for the counting of the applicable page. The actual size of the recurring page is set by the number of bits contained in the register 304. In an example, if the page size register 304 is 6 bits wide, the recurring page size will be 64 units. However, if the value in the page size register 304 is, for example, 48, then the output signal 310 will change state at count 48 and every 64 counts thereafter.

In other embodiments, an XNOR gate may be used in place of the XOR gate 306 for changing the value of the output signal 310. Various combinations of gates and register values may be used by those skilled in the arts while maintaining within the spirit and intent of the present invention.

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A method for detecting a page boundary in a data stream comprising:
   determining a page size;
   storing said page size in a binary page size register, said binary page register having a predetermined number of bits;
   receiving a data stream address, said data steam address being a binary address corresponding to said data stream;
   performing a Boolean logic operation on said data stream address and said page size using a Boolean logic gate to produce a binary output value;
   comparing said binary output value with a predetermined binary value using a comparator, and
   causing a boundary signal to change state when said output value is equal to said predetermined binary value.

2. The method of claim 1 wherein said Boolean logic operation is an AND operation.

3. The method of claim 1 wherein said Boolean logic operation is an OR operation.

4. The method of claim 1 wherein said Boolean logic operation is an XOR operation.

5. The method of claim 1 wherein said Boolean logic operation is an XNOR operation.

6. The method of claim 1 wherein said Boolean logic operation is an NOR operation.

7. The method of claim 1 wherein said Boolean logic operation is an NAND operation.

8. The method of claim 1 wherein said binary page size register is a programmable memory location.

9. The method of claim 1 wherein said Boolean logic operation, said binary page size register, and said comparator are portions of a single integrated circuit.

10. A detection circuit for detecting a page boundary in a data stream comprising:
    a binary page size register having a predetermined number of bits that is capable of storing a page size;
    an address input for receiving a data stream address that is a binary address corresponding to said data stream;
    a Bloolean logic operator having said binary page size register and said address input as inputs and a resultant output;
    a binary compare register having a predetermined number of bits; and
    a comparator that compares said resultant output and said binary compare register and generates a comparator output.

11. The circuit of claim 10 wherein said Boolean logic operator is an AND operation.

12. The circuit of claim 10 wherein said Boolean logic operator is an NAND operation.

13. The circuit of claim 10 wherein said Boolean logic operator is an OR operation.

14. The circuit of claim 10 wherein said Boolean logic operator is an NOR operation.

15. The circuit of claim 10 wherein said Boolean logic operator is an XOR operation.

16. The circuit of claim 10 wherein said Boolean logic operator is an XNOR operation.

17. The circuit of claim 10 wherein said binary page size register is a programmable memory location.

18. The circuit of claim 1 wherein said Bloolean logic operator, said binary page size register, and said comparator are portions of a single integrated circuit.

19. A method for detecting a page boundary in a data stream comprising:

selecting a page size by determining the amount of data in a page size;

storing said page size in a binary page size register, said binary page register having a predetermined number of bits;

receiving a data stream address, said data stream address being a binary address corresponding to the address of data in said data stream;

performing a Boolean logic operation on said data stream address and said page size using a Boolean logic gate to produce a binary output value;

comparing said binary output value with a predetermined binary value using a comparator, and causing a boundary signal to change state when said output value is equal to said predetermined binary value.

20. A detection circuit for detecting a page boundary in a data stream comprising:

a binary page size register having a predetermined number of bits that store page size;

an address input for receiving a data stream address that is a binary address corresponding to the address of data in said data stream;

a Boolean logic operator having said binary page size register and said address input as inputs and a resultant output;

a binary compare register having a predetermined number of bits; and a comparator that compares said resultant output and said binary compare register and generates a comparator output.

* * * * *